United States Patent
Kindaichi et al.

(10) Patent No.: US 10,988,857 B2
(45) Date of Patent: Apr. 27, 2021

(54) SIC SINGLE CRYSTAL GROWTH APPARATUS CONTAINING MOVABLE HEAT-INSULATING MATERIAL AND GROWTH METHOD OF SIC SINGLE CRYSTAL USING THE SAME

(71) Applicant: SHOWA DENKO K.K., Tokyo (JP)

(72) Inventors: Rimpei Kindaichi, Chiba (JP); Yoshishige Okuno, Chiba (JP); Tomohiro Shonai, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/388,968

(22) Filed: Apr. 19, 2019

(65) Prior Publication Data

US 2019/0330761 A1 Oct. 31, 2019

(30) Foreign Application Priority Data

Apr. 26, 2018 (JP) .............................. JP2018-085806

(51) Int. Cl.
 *C30B 23/06* (2006.01)
 *C30B 23/02* (2006.01)
(52) U.S. Cl.
 CPC ................................... *C30B 23/02* (2013.01)
(58) Field of Classification Search
 CPC ....... C30B 23/00; C30B 23/002; C30B 23/02; C30B 23/06; C30B 23/063; C30B 29/00; C30B 29/10; C30B 29/36; Y10T 117/00; Y10T 117/10; Y10T 117/1016

USPC .... 117/84, 88, 102, 105, 200, 204, 937, 951
See application file for complete search history.

(56) References Cited

U.S. PATENT DOCUMENTS

| | | | | |
|---|---|---|---|---|
| 6,451,112 B1 * | 9/2002 | Hara | ....................... | C30B 23/00 117/101 |
| 2006/0042540 A1 * | 3/2006 | Futatsuyama | ........... | C30B 25/16 117/13 |
| 2012/0060749 A1 * | 3/2012 | Okuno | ................... | C30B 23/005 117/84 |
| 2012/0132139 A1 * | 5/2012 | Kondo | .................... | C30B 23/00 118/725 |

FOREIGN PATENT DOCUMENTS

| JP | 2002-060297 A | 2/2002 |
|---|---|---|
| JP | 2014-012640 A | 1/2014 |
| JP | 2016-117624 A | 6/2016 |

* cited by examiner

*Primary Examiner* — Kenneth A Bratland, Jr.
(74) *Attorney, Agent, or Firm* — Sughrue Mion, PLLC

(57) ABSTRACT

A SiC single crystal growth apparatus of an embodiment includes a seed crystal installation part in which a seed crystal is installable at a position thereof which faces a raw material; a guide member which extends from a periphery of the seed crystal installation part toward the raw material and guides crystal growth performed inside the guide member; and a heat-insulating material which is movable along an extension direction of the guide member on the outside of the guide member.

18 Claims, 9 Drawing Sheets

SIC SINGLE CRYSTAL GROWTH APPARATUS CONTAINING MOVABLE HEAT-INSULATING MATERIAL AND GROWTH METHOD OF SIC SINGLE CRYSTAL USING THE SAME

BACKGROUND OF THE INVENTION

Field of the Invention

The present invention relates to a SiC single crystal growth apparatus and a growth method of a SiC single crystal.

Priority is claimed on Japanese Patent Application No. 2018-085806, filed on Apr. 26, 2018, the content of which is incorporated herein by reference.

Description of Related Art

Silicon carbide (SiC) has a breakdown electric field larger by one digit than and the band gap three times larger than those of silicon (Si). Moreover, silicon carbide (SiC) has characteristics such as thermal conductivity being about three times higher than silicon (Si). Silicon carbide (SiC) is expected to be applied to power devices, high frequency devices, high temperature operation devices, and the like. For such SiC devices, a SiC epitaxial wafer is used recently.

The SiC epitaxial wafer is manufactured by growing a SiC epitaxial wafer serving as an active region of a SiC semiconductor device on a SiC single crystal substrate by chemical vapor deposition (CVD).

SiC single crystal substrates are fabricated by cutting a SiC single crystal. The SiC single crystal can usually be obtained by a sublimation method. The sublimation method is a method wherein a seed crystal made of the SiC single crystal is placed on a base disposed in a crucible made of graphite, and the sublimation gas sublimated from raw material powder in the crucible is supplied to the seed crystal by heating the crucible, and the seed crystal is grown to a larger SiC single crystal.

In recent years, increase in diameter of the SiC single crystal substrate on which a SIC epitaxial wafer is grown is expected in response to market demands. Consequently, the SiC single crystal itself is also expected to have the larger diameter and the longer length. For example, Patent Document 1 recites a single crystal growth apparatus provided with a tapered guide member to increase the diameter of the SiC single crystal.

Additionally, the higher quality of the SiC single crystal is also increasingly demanded as well as the larger diameter and the longer length. There are various factors in crystal growth of the SiC single crystal that affect the quality of the SiC single crystal.

A shape of the SiC single crystal and temperature condition while the SiC single crystal is crystal-growing are factors influencing the quality of the SiC single crystal. Patent Document 2 recites a method for controlling a shape of the SiC single crystal by preparing a heat-insulating material at a predetermined position. Patent Document 3 describes that the temperature distribution in a furnace can be tailored more freely by placing a heat-insulating material in a closed space separated from raw material gas.

CITATION LIST

Patent Literature

Patent Document 1: Japanese Unexamined Patent Application, First Publication No. 2002-060297

Patent Document 2: Japanese Unexamined Patent Application, First Publication No. 2014-012640

Patent Document 3: Japanese Unexamined Patent Application, First Publication No. 2016-117624

SUMMARY OF THE INVENTION

However, the temperature condition in the furnace during crystal growth cannot be sufficiently controlled, and thus the shape of the SiC single crystal cannot be freely controlled, with the methods described in Patent Documents 1 to 3.

The present invention is made based on the problems stated above, of which an object is to provide a SiC single crystal growth apparatus and a growth method of a SiC single crystal, capable of controlling a shape of the crystal-grown single crystal.

The inventors of the present invention have found that a shape of a single crystal can be controlled by controlling a position of a heat-insulating material with respect to a surface of the single crystal grown from a seed crystal based on the intensive studies. That is, in order to solve the above problems, the present invention provides as follows.

(1) A SiC single crystal growth apparatus according to a first aspect includes a seed crystal installation part in which a seed crystal is installable at a position thereof which faces a raw material; a guide member which extends from a periphery of the seed crystal installation part toward the raw material and guides crystal growth performed inside the guide member; and a heat-insulating material which is movable along an extension direction of the guide member on the outside of the guide member.

(2) The SiC single crystal growth apparatus according to the first aspect may further include a support which supports the guide member at an end thereof on a raw material side, in which the support has a structure which suppresses entry of a raw material gas into the outside of the guide member.

(3) A growth method of a SiC single crystal according to a second aspect is a growth method of a SiC single crystal using the SiC single crystal growth apparatus according to the first aspect, which includes a crystal growth step of growing a single crystal from a seed crystal installed in the seed crystal installation part, wherein a positional relationship between an end surface of a raw material side of the heat-insulating material and a surface of the single crystal is controlled in a process of the crystal growth step.

(4) in the growth method of a SiC single crystal according to the second aspect, the end surface of the raw material side of the heat-insulating material may be controlled to locate within 20 mm from the surface of the single crystal in the process of the crystal growth step.

(5) In the growth method of a SIC single crystal according to the second aspect, the end surface of the raw material side of the heat-insulating material may be controlled to be closer to the seed crystal installation part than the surface of the single crystal in the process of the crystal growth step.

(6) In the growth method of a SiC single crystal according to the second aspect, a thickness of the heat-insulating material may be half or less of a growth amount of the SiC single crystal which is manufactured at 0.2 mm or more.

(7) In the growth method of a SIC single crystal according to the second aspect, the positional relationship between the end surface of the raw material side of the heat-insulating material and the surface of the single crystal may be controlled at the start of the crystal growth step.

The SiC single crystal growth apparatus according to the first aspect can respectively control the position of the heat-insulating material with respect to the single crystal

DETAILED DESCRIPTION OF THE INVENTION

Hereinafter, preferred examples of the SIC single crystal growth apparatus and the growth method of a SIC single crystal, according to the present invention, will be described in detail with reference to the drawings as appropriate. The drawings used in the following description may include dimensions or ratios, enlargedly different from actual components for better understanding of features of the present invention or for the sake of convenience. The materials, dimensions, and the like, exemplified in the following description, are merely examples and the present invention is not limited thereto. Those parameters can be appropriately tailored within the range not departing the gist of the present invention. Unless otherwise specified, number, size, position, material, ratio, shape, etc. may be changed, added or omitted as necessary.

(SiC Single Crystal Growth Apparatus)

Figure 1:
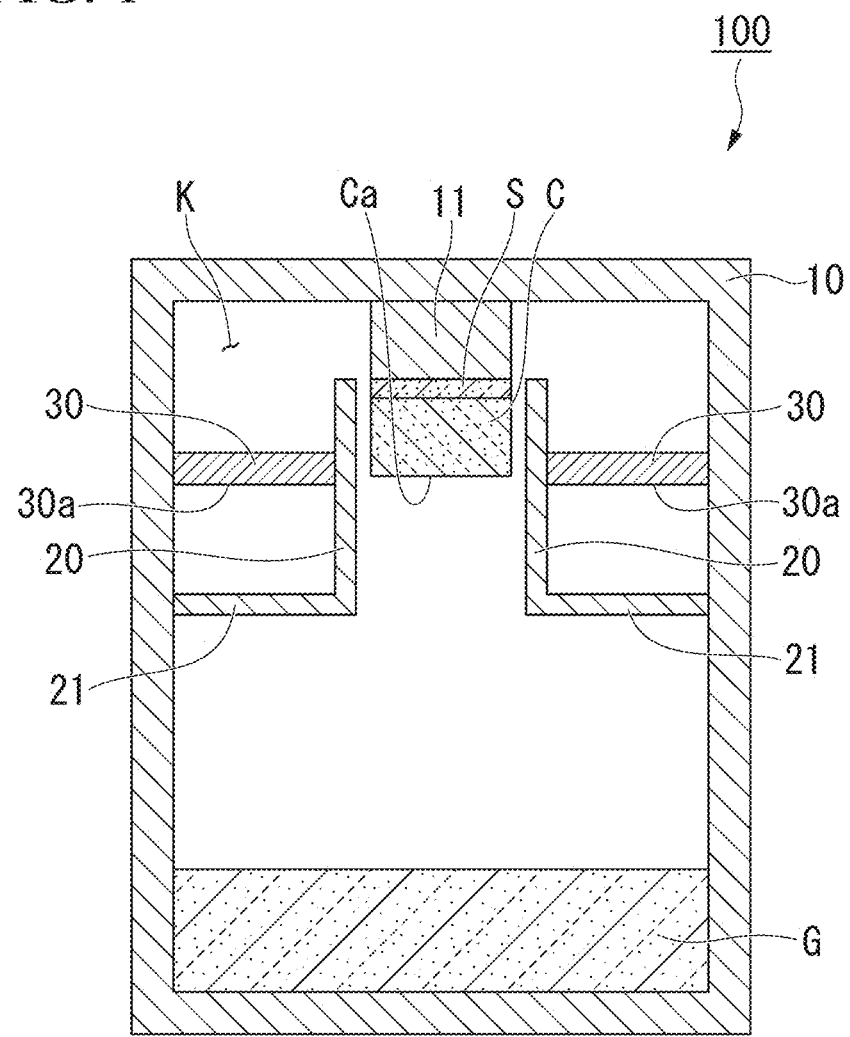
FIG. 1 is a schematic cross-sectional view showing a preferred example of a SiC single crystal growth apparatus according to an embodiment.

FIG. 1 is a schematic cross-sectional view showing an example of a SiC single crystal growth apparatus according to an embodiment. The SiC single crystal growth apparatus 100, as shown in FIG. 1, includes a crucible 10, a seed crystal installation part 11, a guide member 20, and a heat-insulating material 30. In FIG. 1, a raw material G, a seed crystal S, and a single crystal C grown on the seed crystal S are illustrated simultaneously for better understanding.

As shown in the drawings, a direction in which the seed crystal installation part 11 and the raw material G face each other is defined as a vertical direction, and a direction perpendicular to the vertical direction is defined as a left-and-right direction.

The crucible 10 surrounds a film formation space K in which the single crystal C grows. A well-known crucible may serve as the crucible 10 as long as it is a crucible which can produce the single crystal C by a sublimation method. For example, a crucible made of graphite, tantalum carbide or the like can be employed. The crucible 10 is hot during growth, which is necessarily formed of a material tolerable to high temperature. For example, graphite has a very high melting point of 3550° C., and thus is tolerable to the high temperature during growth.

The seed crystal installation part 11 is provided at a position facing the raw material G in the crucible 10. A raw material gas can be efficiently supplied to the seed crystal S and the single crystal C since the seed crystal installation part 11 is located at a position facing the raw material G.

The guide member 20 extends from a periphery of the seed crystal installation part 11 toward the raw material G. That is, the guide member 20 is disposed along a crystal growth direction of the single crystal C. Consequently, the guide member 20 serves as a guide when the single crystal C crystal-grows from the seed crystal S. Crystal growth is carried out on an inner side, that is, on an inner surface side of the guide member 20.

A lower end of the guide member 20 is supported by a support 21.

The support 21 closes a space between the lower end of the guide member 20 and the crucible 10 to suppress entry of the raw material gas into a region outside the guide member 20. If the raw material gas intrudes into the region, polycrystals grow between the guide member 20 and the heat-insulating material 30, and the free movement of the heat-insulating material 30 is inhibited.

A connection between the guide member 20 and the support 21 is preferably a caulking structure. The caulking structure is a structure designed to tighten the connection between the guide member 20 and the support 21 in case where physical force is applied to the guide member 20. For example, a screw structure in which the connection is threaded is an example of the caulking structure. The guide member 20 may be in physically contact with the crystal-grown single crystal C, in which the guide member 20 can be prevented from falling off.

Figure 2:
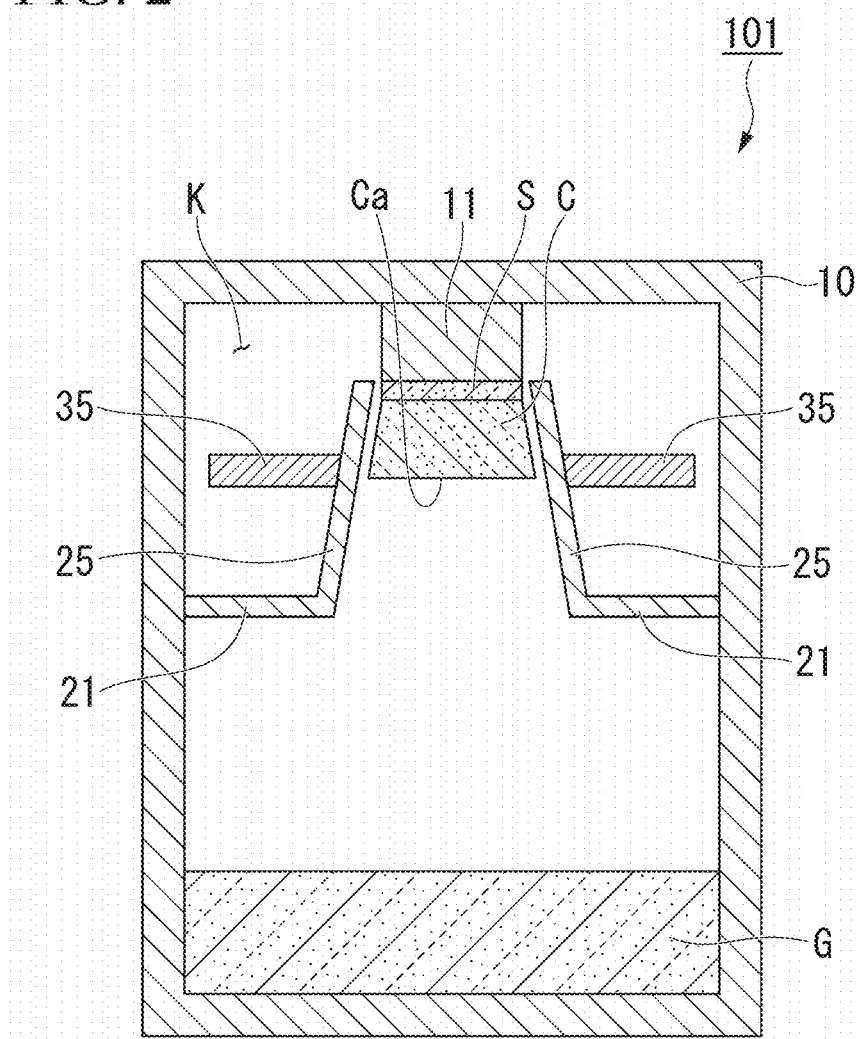
FIG. 2 is a schematic cross-sectional view showing another example of the SiC single crystal growth apparatus according to the embodiment.

The guide member 20 in FIG. 1 extends vertically in the vertical direction. The shape of the guide member 20 is not limited to the shape shown in FIG. 1, and examples of the shape includes a tubular shape such as a cylindrical shape, and a truncated cone. A thickness of the guide member may be uniform. A length, an inner diameter and an outer diameter of the member may be optionally selected. FIG. 2 is a schematic cross-sectional view showing another example of the SiC single crystal growth apparatus 101 according to the embodiment. The guide member 25 in FIG. 2 is expanded in diameter toward the raw material G from the seed crystal installation part 11. The diameter of the single crystal C can be increased by expanding the diameter of the guide member 25.

An upper end of the guide member 20 is open in the example shown in FIG. 1. However, the upper end of the guide member 20 may be connected to an inner surface of the crucible 10 to close a space where the heat-insulating material 30 is provided.

A surface of the guide member 20 is preferably coated with tantalum carbide. The guide member 20 is always exposed to the raw material gas to control the flow of the raw material gas. For example, in a case where the guide member 20 is formed of graphite and the guide member 20 is used while graphite is completely exposed, graphite may react with the raw material gas to be deteriorated and get damaged. Deterioration and damage of graphite may cause the guide member 20 to be perforated, and also cause a phenomenon that carbon powder peeled by degradation is taken into the single crystal C and the quality of single crystal C becomes worse. Meanwhile, tantalum carbide can tolerable to high temperature and does not cause an undesirable reaction with the raw material gas. Therefore, high-quality SiC single crystal growth can be stably performed. The guide member 20 may be formed of tantalum carbide only.

The heat-insulating material 30 is movable along an extension direction of the guide member 20 on the outside of the guide member 20. The outside of the guide member 20 may indicate an outer surface side of the guide member. A position of a surface Ca of the single crystal C can move due to growth. The heat-insulating material 30 is moved, whereby it is possible to control a positional relationship between an end surface on a raw material G side of the heat-insulating material 30 (hereinafter referred to as a lower surface 30a) and the surface Ca of the single crystal C. Therefore, a temperature distribution in the vicinity of the surface Ca of the single crystal C can be freely controlled, and a surface shape of the crystal-grown single crystal C can also be freely controlled.

Figure 3A:
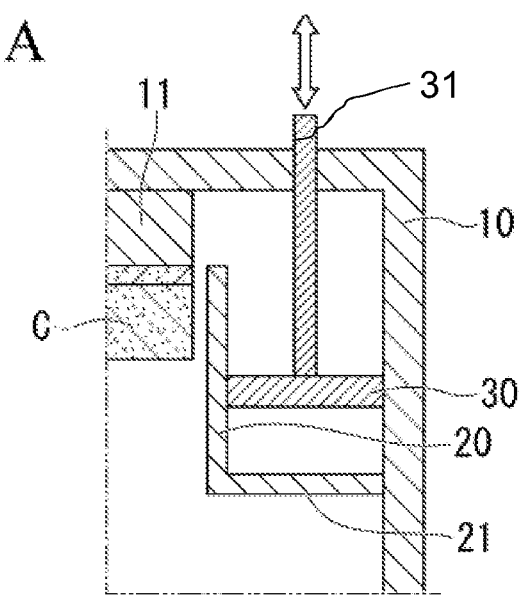
FIG. 3A is a schematic cross-sectional view showing a preferred example of a driver for moving a heat-insulating material up and down in the SiC single crystal growth apparatus according to the embodiment.
Figure 3B:
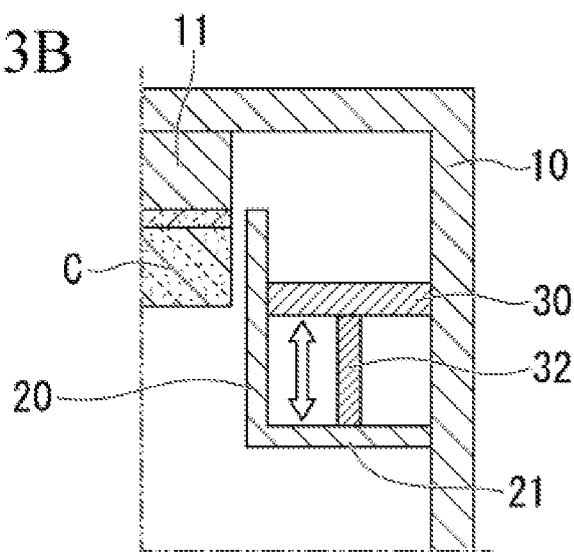
FIG. 3B is a schematic cross-sectional view showing a preferred example of the driver for moving the heat-insulating material up and down in the SiC single crystal growth apparatus according to the embodiment.
Figure 3C:
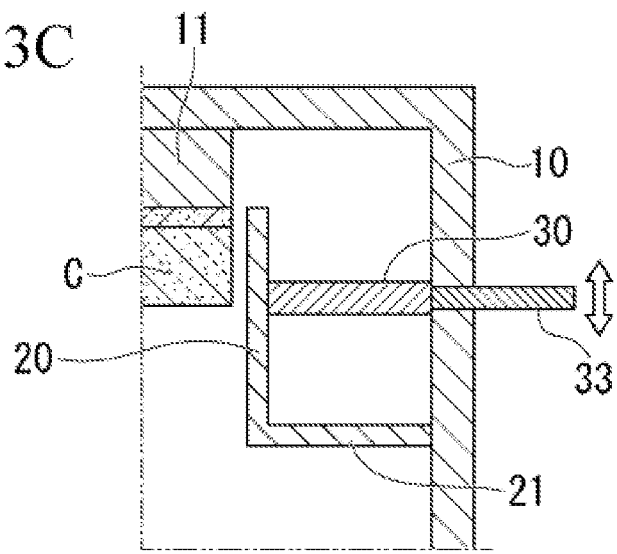
FIG. 3C is a schematic cross-sectional view showing a preferred example of the driver for moving the heat-insulating material up and down in the SiC single crystal growth apparatus according to the embodiment.

FIGS. 3A to 3C are schematic cross-sectional views, each showing a preferred example of a driver for moving the heat-insulating material 30 up and down. The driver is not particularly limited as long as the heat-insulating material 30 can be moved in the vertical direction. For example, as shown in FIG. 3A, a driving member 31 extending to the outside of the crucible 10 from an upper portion of the heat-insulating material 30 may be provided to move the heat-insulating material 30 by pushing and pulling the driving member up and down. An upper surface of the crucible 10 may be provided with a notch or an opening for passing the driving member. For example, as shown in FIG. 3B, a lift-type driving member 32 may be provided such that the heat-insulating material 30 may be supported from a lower portion thereof. For example, as shown in FIG. 3C, a notch or opening may be provided in part of a side surface of the crucible 10, and a driving member 33 extending to the outside of the crucible 10 may be provided through the notch or opening to move the heat-insulating material 30 by raising and lowering the driving member.

The heat-insulating material 30 is preferably made of a material having thermal conductivity of 40 W/mk or less at high temperature of 2000° C. or more. Examples of the material having thermal conductivity of 40 W/mk or less at high temperature of 2000° C. or more include a graphite member having thermal conductivity of 120 W/mk or less at normal temperature. Moreover, it is more preferable that the heat-insulating material 30 is formed of a material having thermal conductivity of 5 W/mk or less at high temperature 2000° C. or more. Examples of the material having thermal conductivity of 5 W/mk or less at high temperature 2000° C. or more include a felt material mainly containing graphite and carbon.

The shape of the heat-insulating material 30 is appropriately designed in accordance with a shape of a region sandwiched by the guide member 20 and the inner surface of the crucible 10. The shape of the heat-insulating material can be optionally selected, and may be, for example, donut shaped. As shown in FIG. 1, in a case where a distance between the guide member 20 and the inner surface of the crucible 10 is constant, the heat-insulating material 30 can be arranged to fill in a gap between them. As shown in FIG. 2, in a case where the distance between the guide member 25 and the inner surface of the crucible 10 varies, the shape of the heat-insulating material 35 can be designed in accordance with the position at which the gap between them is the narrowest such that a width of the heat-insulating material is adjusted to be the same as or smaller than a distance at which the gap between them is the narrowest. With such a design, the heat-insulating material 35 is movable, and immovable clogging between the guide member 25 and the inner surface of the crucible 10 can be avoided.

The thickness of the heat-insulating material 30 can be optionally selected, but preferably 0.2 mm or more, more preferably 5 mm or more, still more preferably 20 mm or more. In a case where the heat-insulating material 30 is too thin, a sufficient heat-insulating effect may not be achieved. It is preferable that the thickness of the heat-insulating material 30 is half or less of a length of the single crystal finally manufactured. The length of the single crystal indicates a length in the vertical direction of the single crystal C after crystal growth (the growth amount of the single crystal C). In a case where the growth amount of the single crystal is 100 mm, the thickness of the heat-insulating material 30 is preferably 50 mm or less. In a case where the growth amount of the single crystal is 50 mm, the thickness of the heat-insulating material 30 is preferably 25 mm or less. In a case where the thickness of the heat-insulating material 30 is too thick, the movement of the heat-insulating material 30 is inhibited. If the thickness of the heat-insulating material 30 falls within the range described above, a temperature difference can be formed in the vertical direction within the single crystal C via the heat-insulating material 30. Consequently, it is possible to prevent the raw material gas from being recrystallized in a portion other than the surface Ca of the single crystal C.

As described above, according to the SiC single crystal growth apparatus of the embodiment, the position of the heat-insulating material can be controlled relatively to the crystal-grown single crystal. It is possible to freely control the temperature distribution in the vicinity of the surface of the single crystal C during crystal growth by controlling the position of the heat-insulating material. Since the single crystal C grows along an isothermal surface, controlling the temperature distribution in the vicinity of the surface of the single crystal C leads to controlling the shape of the single crystal C.

(Growth Method of SiC Single Crystal)

A growth method of a SiC single crystal according to the embodiment uses the SiC single crystal growth apparatus stated above. Hereinafter, a case where the SiC single crystal growth apparatus 100 as shown in FIG. 1 is employed will be described as an example.

The growth method of the SiC single crystal according to the embodiment includes a crystal growth step of growing the single crystal C from the seed crystal S installed in the seed crystal installation part 11. The single crystal C is grown by recrystallization of the raw material gas sublimated from the raw material G on a surface of the seed crystal S. The raw material G is sublimated by heating the crucible 10 with a heater provided outside. The sublimed raw material gas is supplied to the seed crystal S along the guide member 20.

In the growth method of the SiC single crystal according to the present embodiment, the positional relationship between the lower surface 30a of the heat-insulating material 30 and the surface Ca of the single crystal C is controlled in a process of performing crystal growth of the single crystal C from the seed crystal S. The shape of the surface Ca of the single crystal C can be freely controlled by controlling such a positional relationship.

Figure 4A:
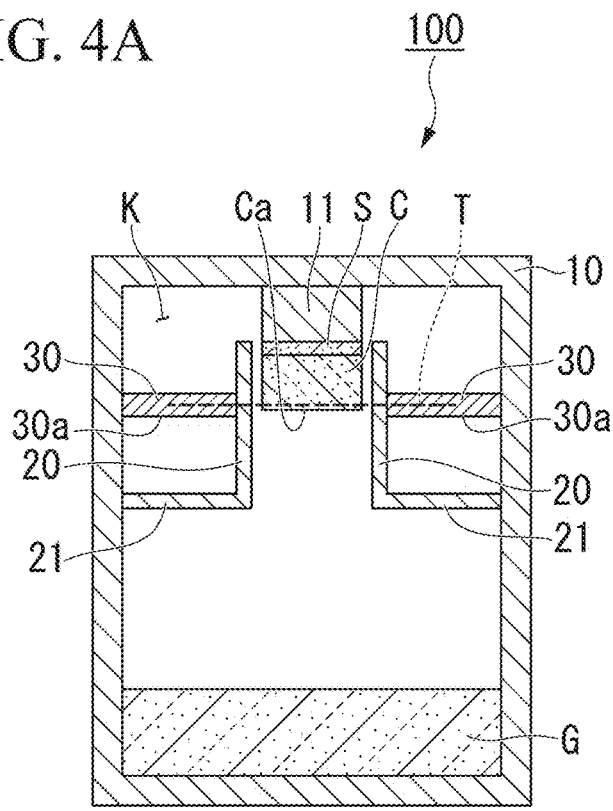
FIG. 4A is a diagram illustrating a positional relationship between a lower surface of the heat-insulating material and a surface (lower main surface) of the single crystal, and a relationship between the positional relationship and an isothermal surface in the vicinity of the single crystal.
Figure 4B:
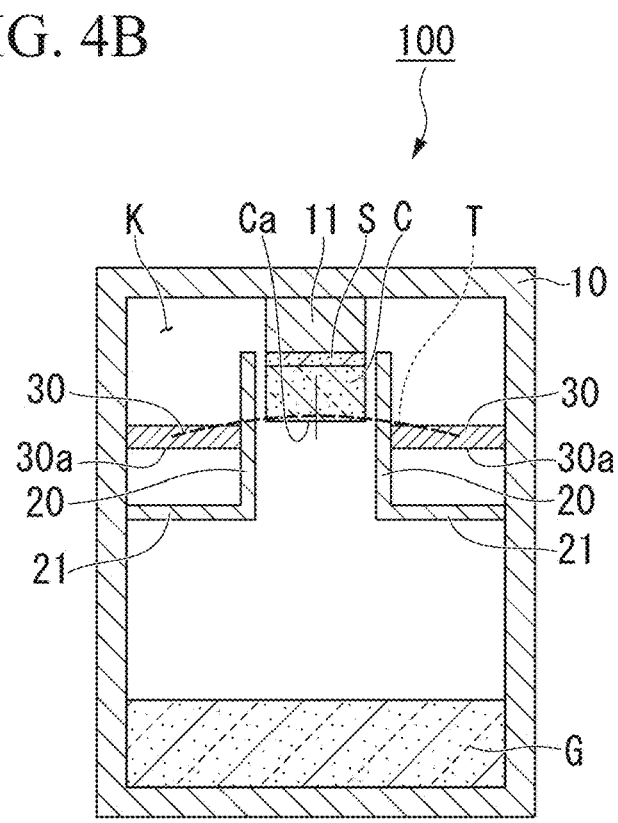
FIG. 4B is a diagram illustrating a positional relationship between a lower surface of the heat-insulating material and a surface (lower surface) of the single crystal, and a relationship between the positional relationship and an isothermal surface in the vicinity of the single crystal.
Figure 4C:
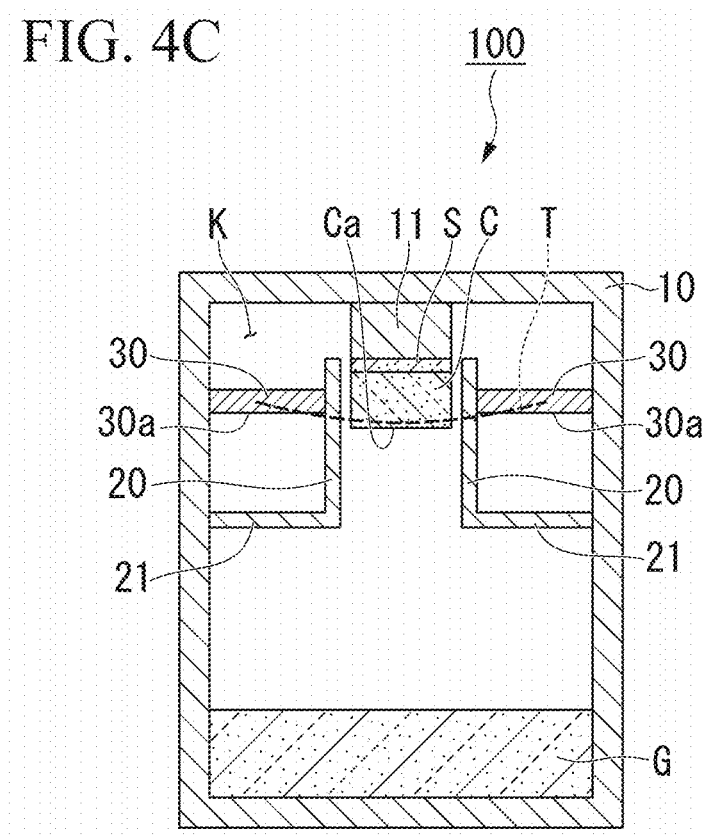
FIG. 4C is a diagram illustrating a positional relationship between a lower surface of the heat-insulating material and a surface (lower surface) of the single crystal, and a relationship between the positional relationship and an isothermal surface in the vicinity of the single crystal.

FIG. 4 shows the positional relationship between the lower surface 30a of the heat-insulating material 30 and the surface Ca of the single crystal C, and the relationship between the positional relationship and the isothermal surface in the vicinity of the single crystal C. FIG. 4A is an example in a case where the surface Ca (crystal growth surface) of the single crystal C is flat. FIG. 4B is an example in a case where the surface Ca (crystal growth surface) of the single crystal C is concave. FIG. 4C is an example in a case where the surface Ca (crystal growth surface) of the single crystal C is convex.

As shown in FIGS. 4A to 4C, the shape of the surface Ca of the single crystal C varies depending on the position of the heat-insulating material 30 with respect to the surface Ca of the single crystal C. As shown in FIG. 4A, in a case where the position of the surface Ca of the single crystal C and the position of the lower surface 30a of the heat-insulating material 30 are substantially the same, the surface Ca of the single crystal C is flat. As shown to FIG. 4B, in a case where the lower surface 30a of the heat-insulating material 30 is disposed closer to the raw material G side than the surface Ca of the single crystal C, the surface Ca of the single crystal C is concave. As shown in FIG. 4C, in a case where the surface Ca of the single crystal C is disposed closer to the raw material G than the lower surface 30a of the heat-insulating material 30, the surface Ca of the single crystal C is convex. That is, a convex shape is formed downward. A dotted line in the drawing indicates the isothermal surface T.

Figure 5A:
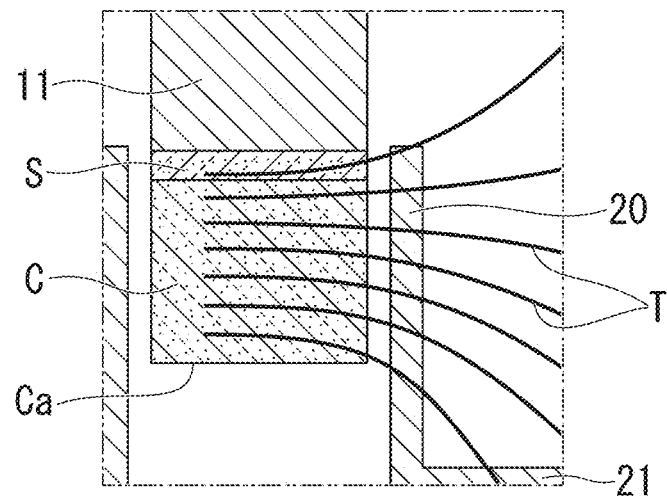
FIG. 5A is a schematic diagram illustrating a shape of the isothermal surface in the vicinity of the single crystal during crystal growth.
Figure 5B:
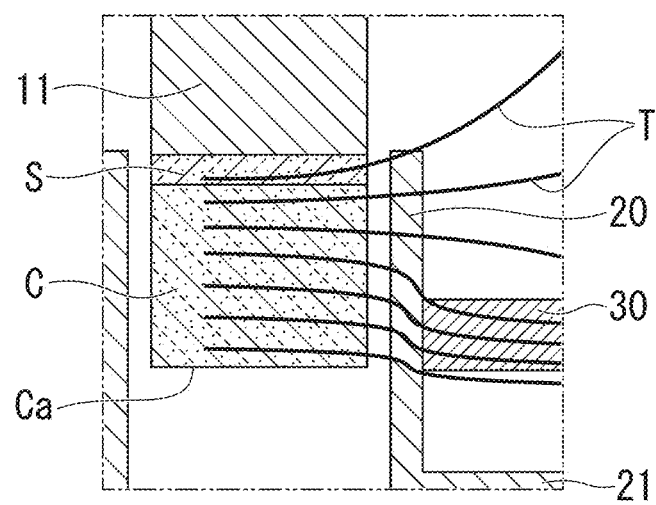
FIG. 5B is a schematic diagram illustrating a shape of the isothermal surface in the vicinity of the single crystal during crystal growth.

The shape of the surface Ca of the single crystal C varies depending on the position of the heat-insulating material 30 with respect to the surface Ca of the single crystal C because the shape of the isothermal surface T varies in the film formation space K. FIGS. 5A and 5B are diagrams schematically showing the shape of the isothermal surface T in the vicinity of the single crystal C during crystal growth. FIG. 5A is a view in a case where the heat-insulating material 30 is not provided. FIG. 5B is a view in a case where the heat-insulating material 30 is provided.

The single crystal C of SiC has a thermal insulation effect due to its low thermal conductivity. Meanwhile, the guide member 20 has higher thermal conductivity than that of the single crystal C. Consequently, as shown in FIG. 5A, the isothermal surface T in a case where the heat-insulating material 30 is not provided is formed so as to expand from the single crystal C. The crystal growth surface of the single crystal C grows along the isothermal surface T. Therefore, in a case where the heat-insulating material 30 is not provided, the shape of the surface Ca (crystal growth surface) of the single crystal C is fixed in a concave shape.

On the other hand, in a case where the heat-insulating material 30 is provided as shown FIG. 5B, the shape of the isothermal surface T varies. The shape of the isothermal surface T can be freely designed by controlling the position of the heat-insulating material 30 with respect to the single crystal C. Controlling the position may correspond to moving the position in at least one of a lateral direction, a longitudinal direction, and an oblique direction. Designing the shape of the isothermal surface T can be carried out with high accuracy by confirming the shape in advance by simulation or the like. Thus the shape of the surface Ca of the single crystal C can be freely designed by controlling the position of the heat-insulating material 30 with respect to the single crystal C.

In addition, controlling the position of the heat-insulating material 30 with respect to the single crystal C provides the advantageous effects of suppressing adhesion of polycrystals to the guide member 20 and of reducing the temperature difference in an in-plane direction in the single crystal C.

Polycrystals are formed in a low temperature portion in the vicinity of the crystal growth surface of single crystal C. For example, as shown in FIG. 5A, in a case where the temperature difference between the single crystal C and the guide member 20 is large, polycrystals grow on the guide member 20. If the polycrystals grown on the guide member 20 comes in contact with the single crystal C, the crystallinity of the single crystal C is disturbed to cause defects. On the other hand, as shown in FIG. 5B in a case where the heat-insulating material 30 is in the vicinity of the surface Ca of the single crystal C, the temperature difference between the single crystal C and the guide member 20 can be reduced, thereby suppressing growth of polycrystals.

Additionally; if the temperature difference in the in-plane direction in the ingle crystal C is large, stress occurs in the process of growing the single crystal C. The stress occurred in the single crystal C produces distortion, deviation or the like, in a crystal plane. Distortion in the single crystal C or the deviation of a lattice plane may cause killer defects such as basal plane dislocation (BPD).

The detailed description has been described that the shape of the surface Ca (lower main surface) of the single crystal C can be controlled. The shape of the surface Ca of the single crystal C is preferably flat or convex toward the raw material G, because if the shape of the surface Ca of the single crystal C is concave toward the raw material G, the quality is inferior. Adjusting the shape of the surface Ca of the single crystal C to be flat or convex, the positions of the surface Ca of the single crystal C and the lower surface 30a of the heat-insulating material 30 are substantially the same, or alternatively, the surface Ca of the single crystal C is disposed closer to the raw material G than the lower surface 30a of the heat-insulating material 30.

The term "substantially the same" does not mean that the positions of the surface Ca of the single crystal C and the lower surface 30a of the heat-insulating material 30 must be completely at the same height; it means that slight misalignment allowed to the extent which the isothermal surface T is not greatly affected. In particular, if the lower surface 30a of the heat-insulating material 30 is disposed within 30 mm from the surface Ca of the single crystal C, the surface Ca of the single crystal C and the lower surface 30a of the heat-insulating material 30 have the positional relationship that they are substantially the same. In order to adjust the shape of the surface Ca of the single crystal C to be flat, it is preferable that the surface Ca of the single crystal C and the lower surface 30a of the heat-insulating material 30 has the positional relationship that they are nearly identical. It is also preferable that the lower surface 30a of the heat-insulating material 30 is disposed within 20 mm from the surface Ca of the single crystal C, more preferable that the lower surface 30a of the heat-insulating material 30 is disposed within 10 mm.

The surface Ca of the single crystal C is preferably disposed closer to the raw material G than the lower surface 30a of the heat-insulating material 30. That is, it is preferable that the lower surface 30a of the heat-insulating material 30 is disposed closer to the seed crystal installation part 11 than the surface Ca of the single crystal C. Accordingly, even when an external factor such as a temperature fluctuation in the film forming space K occurs, the concave shape of the surface Ca of the single crystal C can be prevented.

It is preferable to control the position of the heat-insulating material 30 from the start of crystal growth. That is, it is preferable to control the positional relationship between the lower surface 30a of the heat-insulating material 30 and the surface of the seed crystal S at the start of crystal growth.

Immediately after the start of crystal growth, the seed crystal installation part 11 is provided around the seed crystal S, and a distance between the seed crystal S and the crucible 10 is also close. Therefore, the isothermal surface T in the film formation space K is also influenced by temperature (thermal conductivity) of these members. That is, the effect exerted by using the heat-insulating material 30 is the strongest in a region where the single crystal C has grown 30 mm or more from the seed crystal S. However, it does not mean that the heat-insulating material 30 does not provide any advantageous effect immediately after the start of crystal growth.

For example, in a case where the shape of the crystal growth surface of single crystal C immediately after crystal growth is concave without providing the heat-insulating material 30, it is necessary to return the shape of the crystal growth surface of the single crystal C to a convex shape in the subsequent growth process. If the shape of the crystal growth surface changes from concave to convex in the growth process, stress is accumulated in the single crystal C, and defects are likely to occur. Therefore, the position of the heat-insulating material 30 is preferably controlled from the start of crystal growth. The positional relationship of the heat-insulating material 30 to the seed crystal S can be designed in the same manner as the positional relationship between the heat-insulating material 30 and the single crystal C in the process of crystal growth.

The growth apparatus rind the manufacturing method according to the embodiment can be applied regardless of the size of the grown single crystal. However, the present invention is more suitably applied to the growth of a large single crystal having a diameter of 150 mm or more and a crystal length of 50 mm, in which it is difficult to control the shape of the crystal growth surface.

The preferred embodiments of the present invention have been described in detail above. However, the present invention is not limited to the specific embodiments, and various changes and modifications may be made without departing from the gist of the present invention as described in the scope of the claims.

EXAMPLES

Example 1

In Example 1, on the assumption that the SiC single crystal growth apparatus 100 as shown in FIG. 1 was employed, the temperature distribution in the film formation space K was obtained by simulation. For the simulation, crystal growth analysis software "Virtual Reactor" manufactured by STR-Group Ltd was used. This simulation software is widely used for simulation of the temperature distribution in a furnace, and is confirmed to have high correlation with the actual experimental result.

The simulation was carried out under the following conditions.

Figure 6:
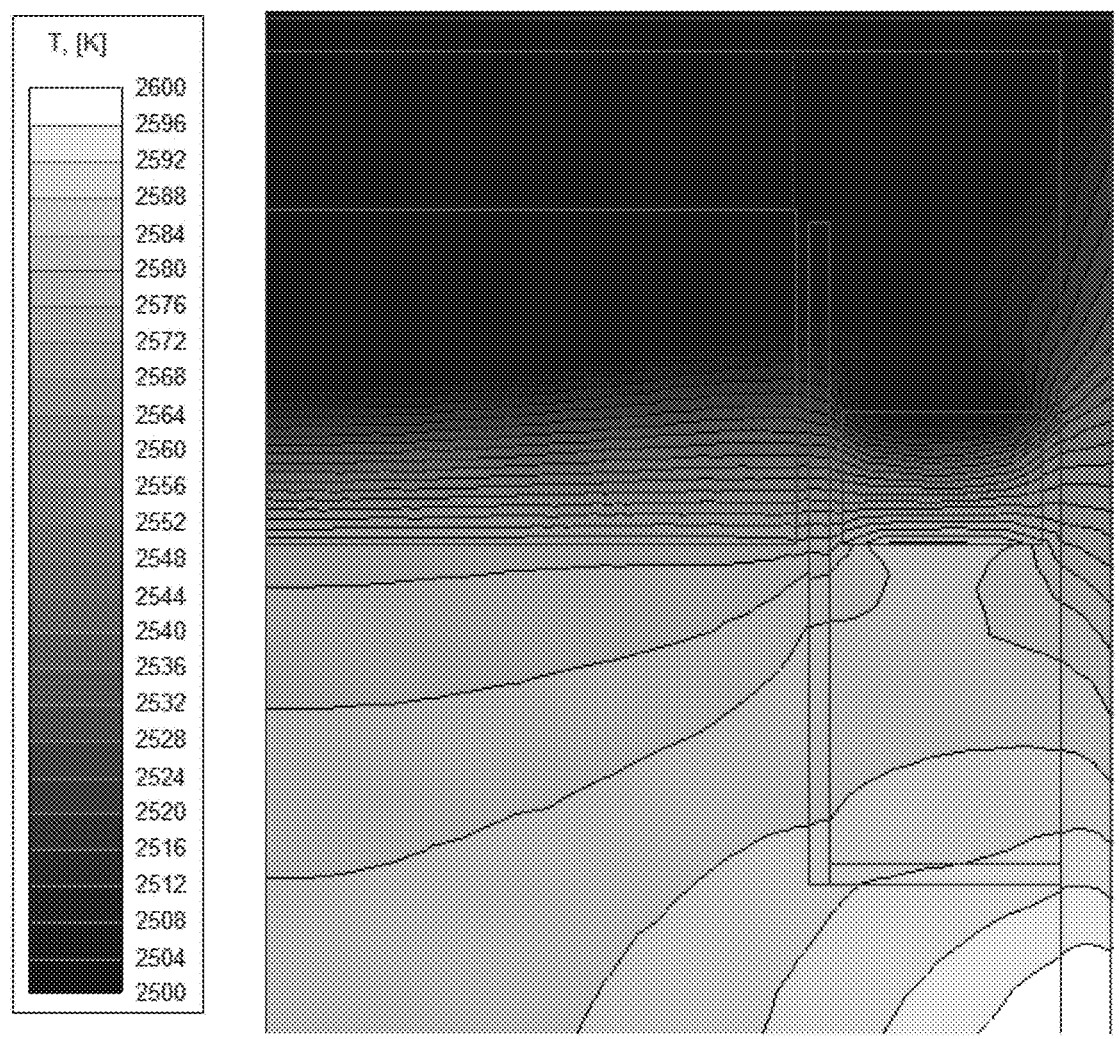
FIG. 6 is a diagram showing a temperature distribution in the vicinity of the single crystal which indicates a simulation result of Example 1.

Thickness of the seed crystal S: 0.5 mm
Thickness of the single crystal C: 50 mm
Radius of the single crystal C: 80 mm
Thickness of the heat-insulating material 30: 20 mm
Thermal conductivity of the heat-insulating material 30: 0.26 W/mk
Thermal conductivity of the guide member 20: 97.5 W/mk
Positional relationship between the surface Ca of the single crystal C and the lower surface 30a of the heat-insulating material 30: perfectly matched FIG. 6 shows the simulation results of Example 1. As shown in FIG. 6, the isothermal surface is flat in the vicinity of the surface Ca of the single crystal C. Since the single crystal C is grown along the isothermal surface, a single crystal C having a flat crystal growth surface can be obtained.

Example 2

Example 2 was carried out in the same procedure as that of Example 1 except that the surface Ca of the single crystal C is disposed closer to the raw material G than the lower surface 30a of the heat-insulating material 30. The surface Ca of the single crystal C was set at a position of 20 mm from the lower surface 30a of the heat-insulating material 30 to the raw material G side.

Figure 7:
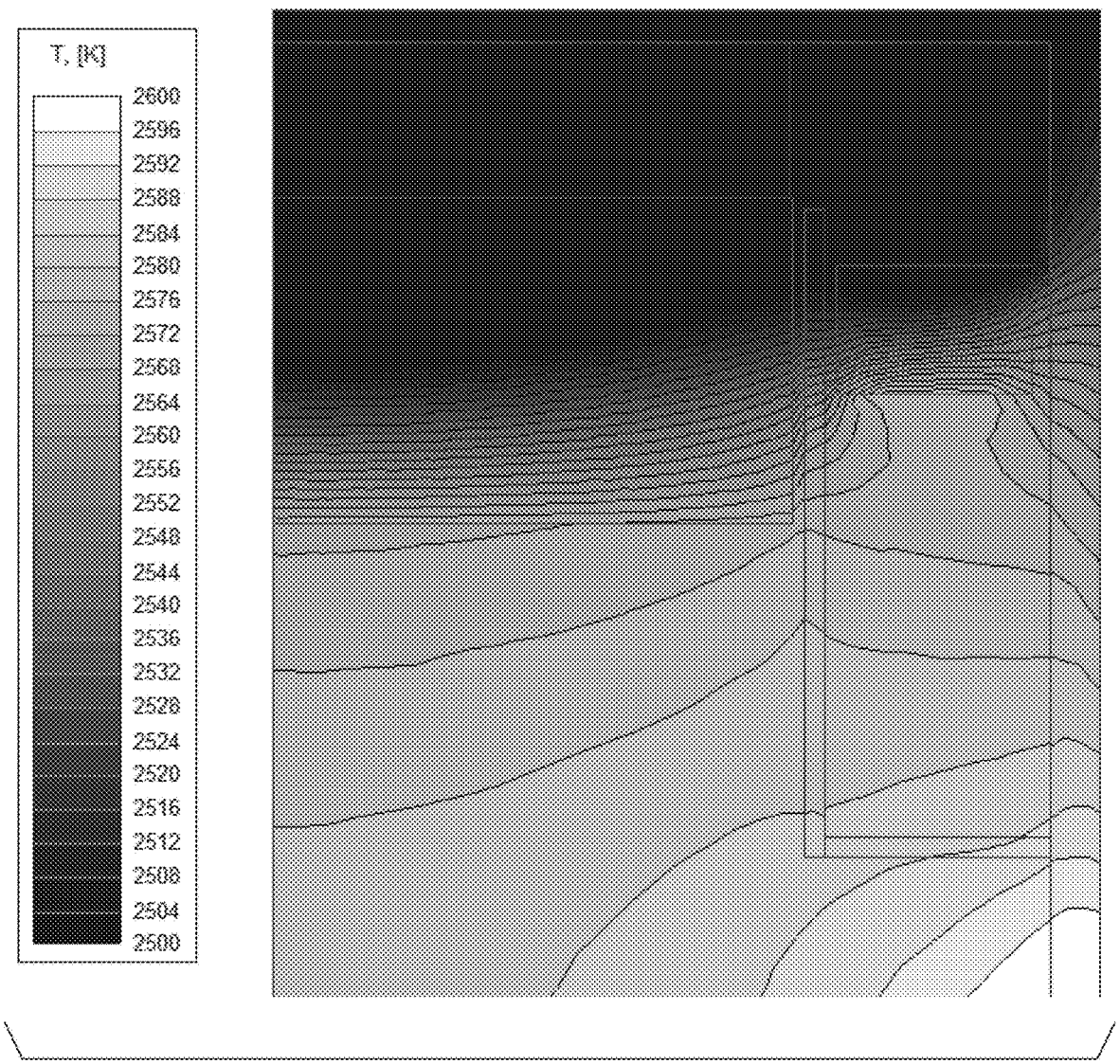
FIG. 7 is a diagram showing a temperature distribution in the vicinity of the single crystal which indicates a simulation result of Example 2.

FIG. 7 shows the simulation results of Example 2. As shown in FIG. 7, the isothermal surface has a convex shape toward the raw material G in the vicinity of the surface Ca of the single crystal C. Since the single crystal C is grown along the isothermal surface, a single crystal C having a convex crystal growth surface can be obtained.

Example 3

Example 3 was carried out in the same procedure as that of Example 1 except that the lower surface 30a of the heat-insulating material 30 is disposed closer to the raw material G side than the surface Ca of the single crystal C. The lower surface 30a of the heat-insulating material 30 was set at a position of 20 mm from the surface Ca of the single crystal C to the raw material G side.

Figure 8:
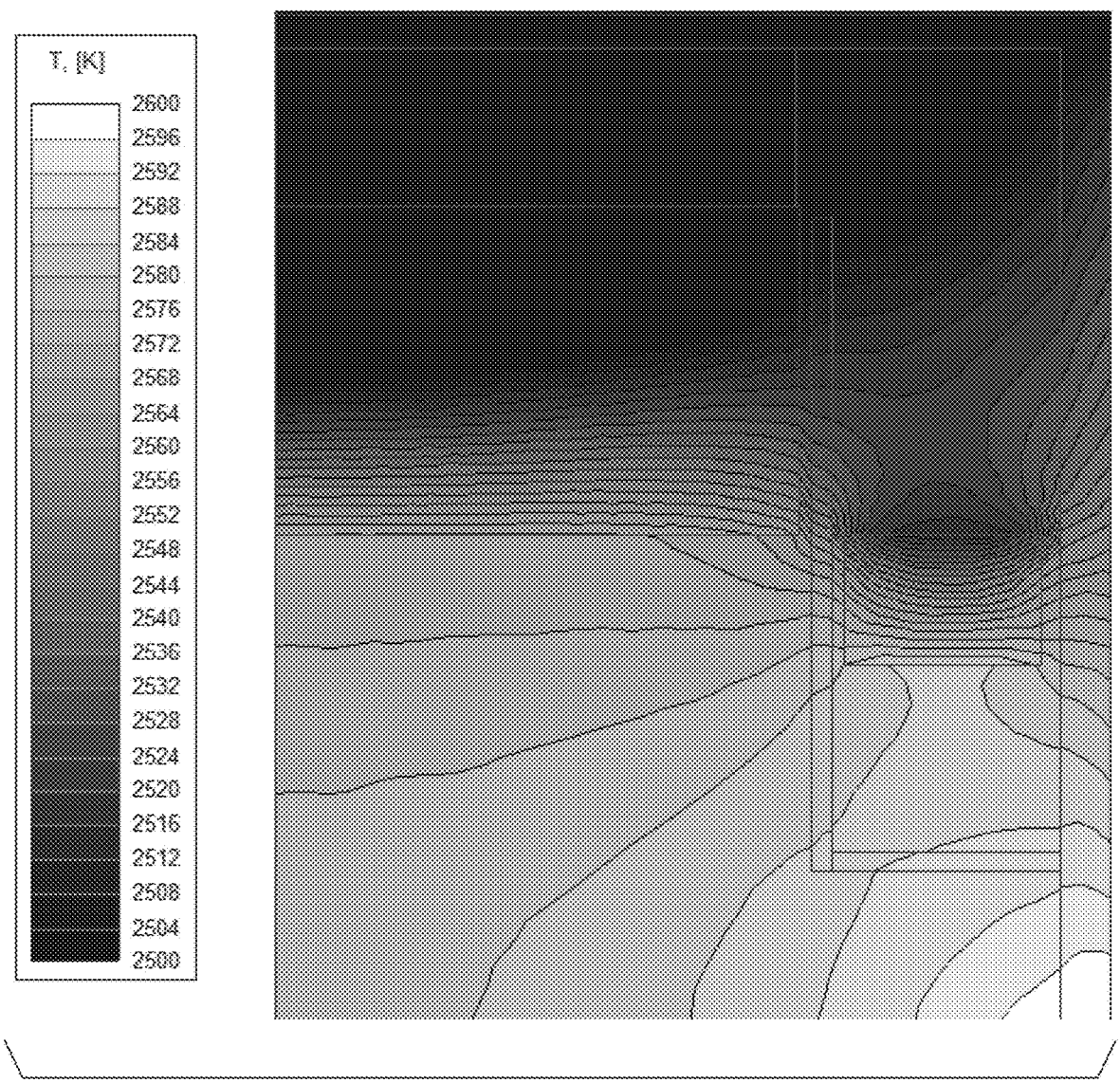
FIG. 8 is a diagram showing a temperature distribution in the vicinity of the single crystal which indicates a simulation result of Example 3.

FIG. 8 shows the simulation results of Example 3. As shown in FIG. 8, the isothermal surface has a concave shape toward the raw material G in the vicinity of the surface Ca of the single crystal C. Since the single crystal C is grown along the isothermal surface, a single crystal C having a concave crystal growth surface can be obtained.

As described above, according to the present invention, it is possible to provide a SIC single crystal growth apparatus and a growth method of a SiC single crystal, capable of controlling a shape of the crystal-grown single crystal.

EXPLANATION OF REFERENCES 10 crucible
11 seed crystal installation part
20, 25 guide member
21 support
30, 35 heat-insulating material
30a lower surface
31, 33 driving member extending to the outside of crucible
32 lift-type driving member
100, 101 SiC single crystal growth apparatus
S seed crystal
C single crystal
Ca surface
G raw material
T isothermal surface
K film formation space

What is claimed is:

1. A SiC single crystal growth apparatus, comprising:
a seed crystal installation part in which a seed crystal is installable at a position thereof which faces a raw material;
a guide member which extends from a periphery of the seed crystal installation part toward the raw material and guides crystal growth performed inside the guide member;
a heat-insulating material which is movable along an extension direction of the guide member on the outside of the guide member, and
a lift-type driving member which is configured to support the heat-insulating material from a lower side of the heat-insulating material and to move the heat-insulating material.

2. The SiC single crystal growth apparatus according to claim 1, further comprising:
a support which supports the guide member at an end thereof on a raw material side,
wherein the support has a structure which suppresses entry of a raw material gas into the outside of the guide member.

3. A growth method of a SiC single crystal using the SiC single crystal growth apparatus according to claim 1, comprising:
a crystal growth step of growing a single crystal from a seed crystal installed in the seed crystal installation part,
wherein a positional relationship between an end surface of a raw material side of the heat-insulating material and a surface of the single crystal is controlled in a process of the crystal growth step using the lift-type driving member which is configured to move the heat-insulating material.

4. The growth method of a SiC single crystal according to claim 3, wherein the end surface of the raw material side of the heat-insulating material is controlled to locate within 20 mm from the surface of the single crystal in the process of crystal growth.

5. The growth method of a SiC single crystal according to claim 3, wherein the end surface of the raw material side of the heat-insulating material is controlled to be closer to the seed crystal installation part than the surface of the single crystal in the process of crystal growth.

6. The growth method of a SiC single crystal according to claim 3, wherein a thickness of the heat-insulating material is half or less of a growth amount of the SiC single crystal which is manufactured at 0.2 mm or more.

7. The growth method of a SiC single crystal according to claim 3, wherein the positional relationship between the end surface of the raw material side of the heat-insulating material and the surface of the single crystal is controlled at the start of crystal growth.

8. The SiC single crystal growth apparatus according to claim 1, wherein the guide member extends vertically in the vertical direction.

9. The SiC single crystal growth apparatus according to claim 8, wherein a lower end of the guide member is supported by a support which closes a space between the lower end of the guide member and the crucible.

10. A SiC single crystal growth apparatus, comprising:
a seed crystal installation part in which a seed crystal is installable at a position thereof which faces a raw material;
a guide member which extends from a periphery of the seed crystal installation part toward the raw material and guides crystal growth performed inside the guide member;
a heat-insulating material which is movable along an extension direction of the guide member on the outside of the guide member, and
a driving member, which extends to an outside of the crucible through a notch or opening which is provided in part of a side surface of the crucible and is configured to move the heat-insulating material by raising and lowering the driving member.

11. The SiC single crystal growth apparatus according to claim 10, further comprising:
a support which supports the guide member at an end thereof on a raw material side,
wherein the support has a structure which suppresses entry of a raw material gas into the outside of the guide member.

12. A growth method of a SiC single crystal using the SiC single crystal growth apparatus according to claim 10, comprising:
a crystal growth step of growing a single crystal from a seed crystal installed in the seed crystal installation part,
wherein a positional relationship between an end surface of a raw material side of the heat-insulating material and a surface of the single crystal is controlled in a process of the crystal growth step using the driving member which is configured to move the heat-insulating material.

13. The growth method of a SiC single crystal according to claim 12, wherein the end surface of the raw material side of the heat-insulating material is controlled to locate within 20 mm from the surface of the single crystal in the process of crystal growth.

14. The growth method of a SiC single crystal according to claim 12, wherein the end surface of the raw material side of the heat-insulating material is controlled to be closer to the seed crystal installation part than the surface of the single crystal in the process of crystal growth.

15. The growth method of a SiC single crystal according to claim 12, wherein a thickness of the heat-insulating material is half or less of a growth amount of the SiC single crystal which is manufactured at 0.2 mm or more.

16. The growth method of a SiC single crystal according to claim 12, wherein the positional relationship between the end surface of the raw material side of the heat-insulating material and the surface of the single crystal is controlled at the start of crystal growth.

17. The SiC single crystal growth apparatus according to claim 10, wherein the guide member extends vertically in the vertical direction.

18. The SiC single crystal growth apparatus according to claim 17, wherein a lower end of the guide member is supported by a support which closes a space between the lower end of the guide member and the crucible.

* * * * *